United States Patent
Ohsawa et al.

(10) Patent No.: US 8,080,478 B2
(45) Date of Patent: Dec. 20, 2011

(54) METHOD OF PRODUCING MASK

(75) Inventors: Yuichi Ohsawa, Kanagawa-ken (JP); Junichi Ito, Kanagawa-ken (JP); Saori Kashiwada, Kanagawa-ken (JP); Chikayoshi Kamata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/873,652

(22) Filed: Sep. 1, 2010

(65) Prior Publication Data
US 2011/0244688 A1 Oct. 6, 2011

(30) Foreign Application Priority Data

Mar. 31, 2010 (JP) .................................. 2010-083395

(51) Int. Cl.
*H01L 21/00* (2006.01)

(52) U.S. Cl. ........................................ 438/702; 438/733

(58) Field of Classification Search .................. 438/702, 438/696, 733
See application file for complete search history.

(56) References Cited

U.S. PATENT DOCUMENTS

| 4,083,098 | A | 4/1978 | Nicholas | |
|---|---|---|---|---|
| 2009/0152645 | A1* | 6/2009 | Tran | 257/401 |
| 2010/0048024 | A1* | 2/2010 | Sugimura | 438/702 |
| 2010/0112798 | A1* | 5/2010 | Lai et al. | 438/591 |
| 2010/0151613 | A1* | 6/2010 | Mabuchi | 438/59 |
| 2010/0151669 | A1* | 6/2010 | Lindert et al. | 438/589 |
| 2010/0248483 | A1* | 9/2010 | Orita | 438/700 |

FOREIGN PATENT DOCUMENTS

JP 2009-130035 6/2009

* cited by examiner

*Primary Examiner* — Thao P. Le

(74) *Attorney, Agent, or Firm* — Oblon, Spivak, McClelland, Maier & Neustadt, L.L.P.

(57) ABSTRACT

According to one embodiment, a method of producing a mask includes: a step of forming a pattern on a substrate; a step of forming a first film that covers the top surface and side surface of the pattern and contains a first material; a step of forming a second film containing a second material on the first film; a step of performing anisotropic etching of the first and second films in a way that forms a sidewall layer including the first and second films on the side surface of the pattern and removes the first and second films on any location other than the sidewall layer; a step of performing isotropic etching of the first film of the sidewall layer; and a step of removing the pattern.

9 Claims, 9 Drawing Sheets

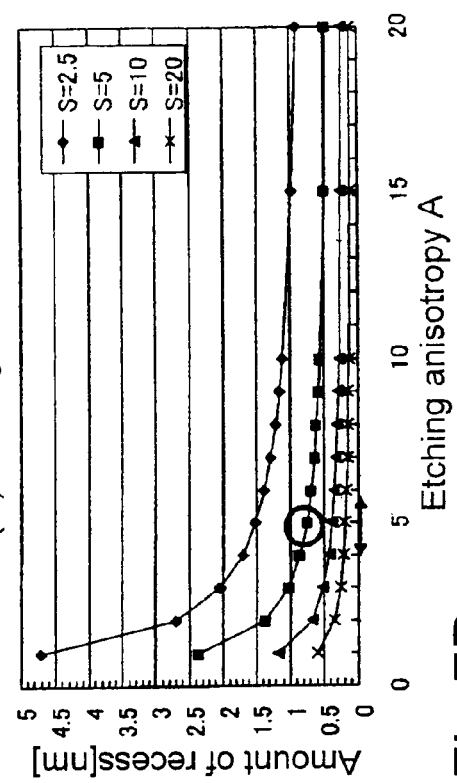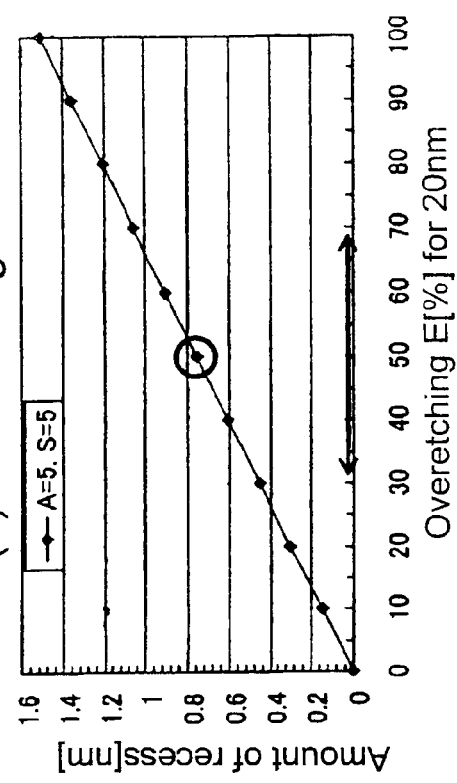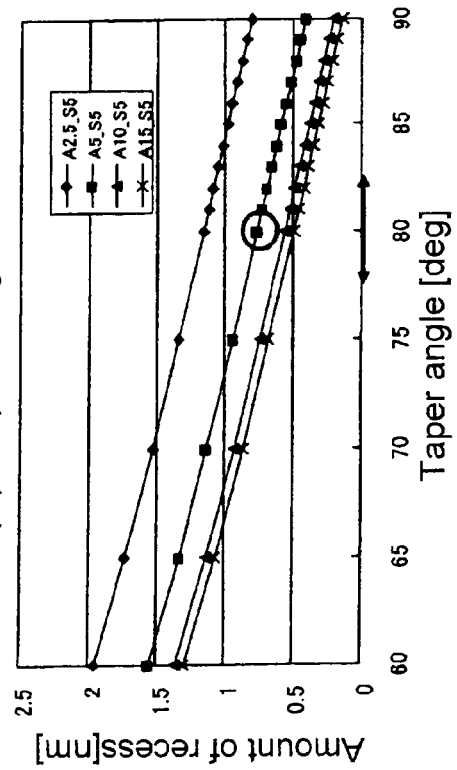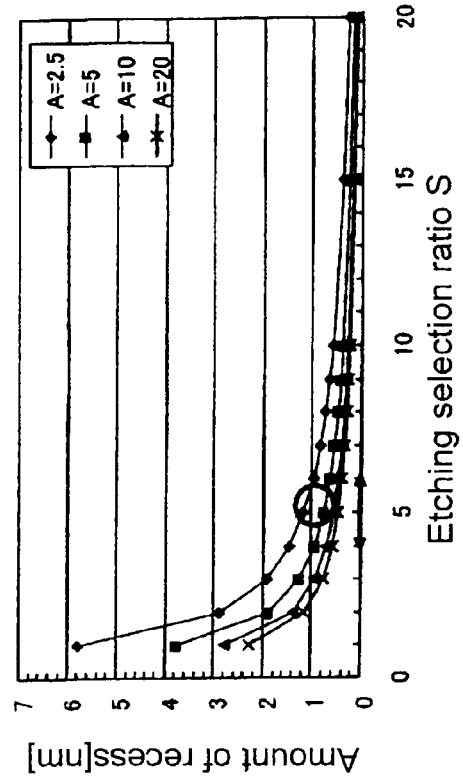

Fig.8

| Factors of variation | Recess changes | Expected changes of center value (6σ) |
|---|---|---|
| Taper θ | 0.190nm | 80 +/- 2.5deg |
| Anisotropy A | 0.167nm | 5 +/- 20% |
| Selection ratio S | 0.314nm | 5 +/- 20% |
| Overetching E | 0.603nm | 5 +/- 20% |
| Combined variation Rate of variation | 0.725nm 3.6% | |

Fig. 10

| Factors of variation | Conventional method | Present embodiment |
|---|---|---|
| Taper θ | 0.190nm<br>80 +/-2.5 deg | 0.076nm<br>89 +/- 1 deg |
| Anisotropy A | 0.167nm<br>5 +/-20% | 0.013nm<br>18 +/-20% |
| Selection ratio S | 0.314nm<br>5 +/-20% | 0.013nm<br>10 +/-20% |
| Overetching E | 0.603nm<br>5 +/-20% | 0.059nm<br>50 +/-20% |
| Combined variation | 0.725nm | 0.098nm | ns
METHOD OF PRODUCING MASK

CROSS-REFERENCE TO RELATED APPLICATION

This application is based upon and claims the benefit of priority from the prior Japanese Patent Application No. 2010-083395 filed on Mar. 31, 2010, the entire contents of which are incorporated herein by reference.

FIELD

Embodiments described herein relate generally to a method of producing a mask for micro-processing.

BACKGROUND

In recent years, for portable information devices and many other information storage devices, an increase in the capacity of a memory has contributed not only to improved performance but also to environmental issues given a reduction in carbon dioxide emissions per bit.

A Magnetic Random Access Memory (MRAM) is a non-volatile memory that uses magnetism, thereby reducing power consumption in standby mode. The MRAM is expected to help personal computers save more power.

Increases in the capacity of hard disk drives or solid-state memories have been achieved by increasing the functionality of an optical exposure system to reduce the writing/reading size of one bit. In recent years, it has become possible to write a finer pattern with the use of a KrF excimer stepper, ArF excimer stepper or immersion ArF excimer stepper.

In order to further decrease the size of one bit and increase the capacity of a device, the International Technology Roadmap for Semiconductors (ITRS) focuses on the next-generation mask formation technologies, such as an exposure device and direct-writing electron beam exposure device that use an EUV (Extreme Ultra Violet) ray, a technique, called double patterning, of carrying out shift exposure twice, and a technique of transferring a thin film formed on a side wall as a mask.

According to the sidewall transfer (SWT) method, a formative layer (sidewall film) is formed to form an uneven pattern on the periphery of a guide (core) pattern that is formed by exposure or other methods. The formative layer (sidewall film) is trimmed by etching to selectively leave the layer on the side wall of the core. Then, the core is removed to form the uneven pattern of the formative layer. Since the sidewall transfer technique uses the thin film formed on the side wall as the width of a mask, the limit width dimension is considered to be at atomic levels in principle.

According to the sidewall transfer method, it is desirable that the mask pattern formed be in the shape of a rectangle whose angles are substantially right angles; it is necessary to keep the corners from being cut off. High etching anisotropy is required to form a rectangular mask pattern; dry etching is mainly used. Therefore, as for a dry etching condition, the formation of a sidewall protective film whose etching rate is slow compared with the sidewall film leads to an excellent rectangular quality.

Dry etching has both a chemical etching component, which utilizes a chemical reaction, and a physical etching component, which utilizes collision energy of particles. For the chemical etching component, etching proceeds isotropically. For the physical etching component, etching proceeds anisotropically. When etching proceeds isotropically, high anisotropy cannot be obtained.

BRIEF DESCRIPTION OF THE DRAWINGS

FIGS. 7A to 7D are diagrams showing the dependency of a skirt taper angle of the amount of recess, the dependency of etching anisotropy of the amount of recess, the dependency of etching selection ratio of the amount of recess, and the dependency of the amount of overetching of the amount of recess, respectively;

FIG. 8 is a table showing the effects of parameters on recess with each parameter being subject to a controllability range;

FIG. 10 is a table showing the effects of parameters on recess with each parameter being subject to a controllability range in a mask of an embodiment of the present invention.

DETAILED DESCRIPTION

According to one embodiment, a method of producing a mask includes: a step of forming a pattern on a substrate; a step of forming a first film that covers the top surface and side surface of the pattern and contains a first material; a step of forming a second film containing a second material on the first film; a step of performing anisotropic etching of the first and second films in a way that forms a sidewall layer including the first and second films on the side surface of the pattern and removes the first and second films on any location other than the sidewall layer; a step of performing isotropic etching of the first film of the sidewall layer; and a step of removing the pattern.

Hereinafter, an embodiment of the present invention will be described with reference to the accompanying drawings.

The following describes the reason why variation arises in the process of patterning when there is a skirt according to a typical sidewall transfer method.

Figure 6A:
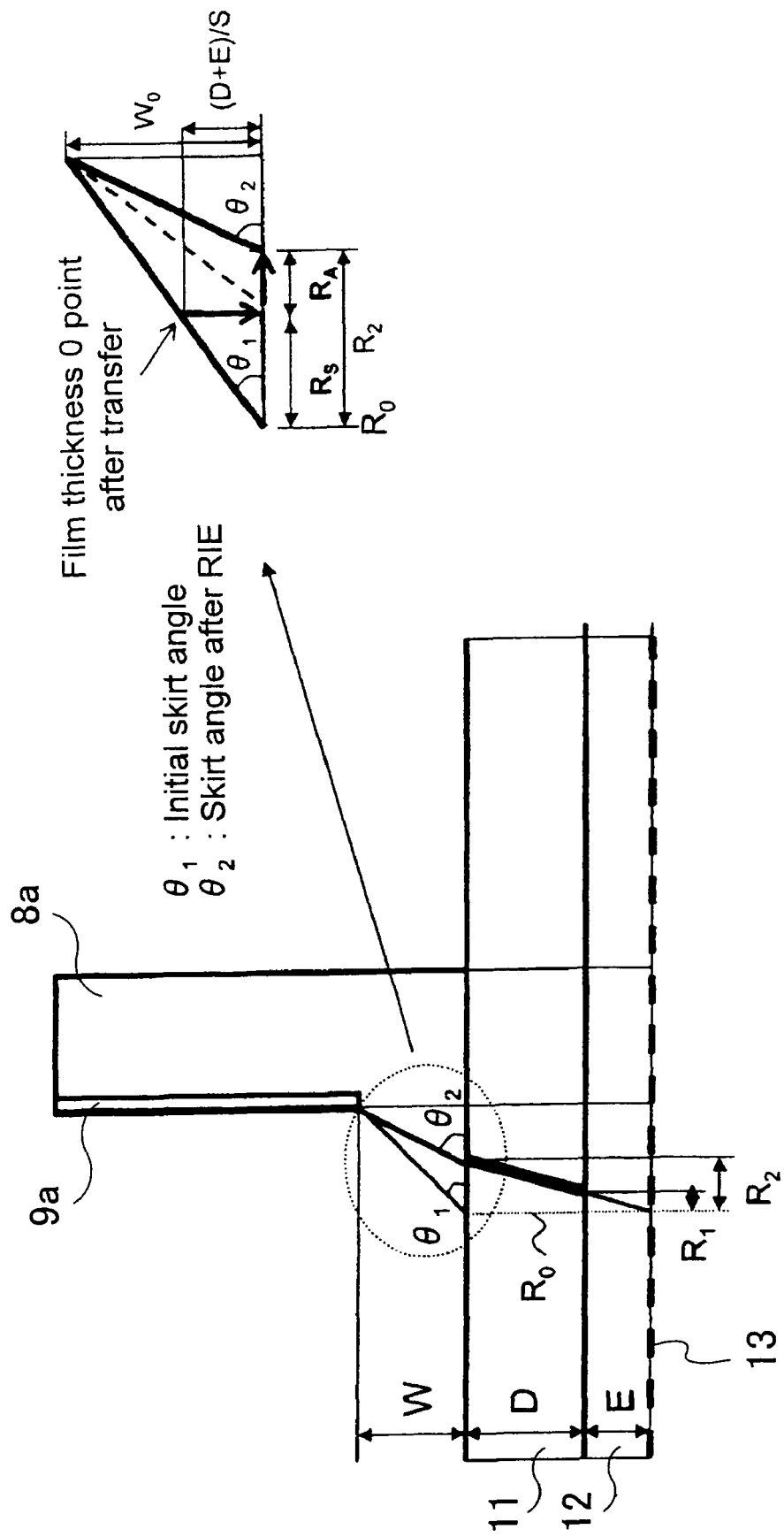
FIGS. 6A and 6B are diagrams showing the progress of etching in an underlying film transfer module.
Figure 6B:
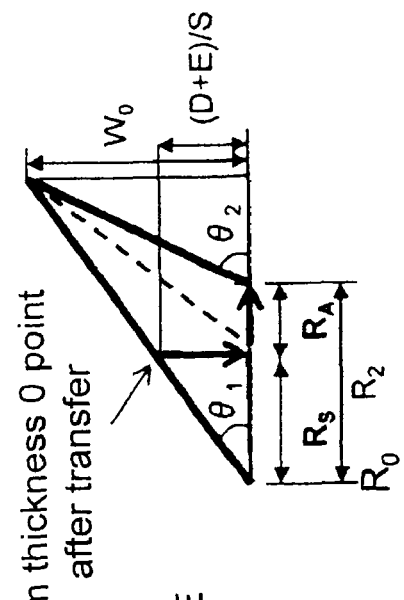

FIGS. 6A and 6B are diagrams illustrating the progress of etching in an underlying film transfer module.

A sidewall film 8a is used to etch an underlying layer film 11 (with a film thickness of D); etching is stopped on the surface of a stopper film 12. Suppose that the edge of the initial taper (with an angle of $\theta_1$) of a skirt portion (encircled by ○ in the diagram) is transferred to the lower film without change, that the edge of the underlying film 11 is positioned at $R_0$ in the case of just etching, and that the recess of $R_1$ progresses as overetching goes on. Overetching E is shown as a virtual etching surface because the underlying film 11 exists even after the process of just etching.

As for the a skirt taper, the initial angle is $\theta_1$ when the height is $W_0$. The skirt taper changes to the final angle $\theta_2$ because of two recess factors (selection ratio S and etching anisotropy A). First, analytically, a recess $R_S$ emerges due to a RIE selection ratio S (=Etching rate ratio) of the sidewall film 8a and underlying film 11. Moreover, a recess $R_A$ is added due to the etching anisotropy A, resulting in a combined recess $R_2$ (=$R_S$+$R_A$). $R_S$, $R_A$ and $R_2$ are given by the following equations:

$$R_S=(D+E)/S \tan^{-1} \theta_1$$

$$R_A=(D+E)/SA$$

$$R_2=R_S+R_A$$

$$=(D+E)/S(\tan^{-1} \theta_1+1/A) \qquad (1)$$

With a triangle whose base is $R_1$ and a similar triangle whose base is $R_2$, the recess $R_1$ caused by overetching is given by:

$$R_1=E/(D+E)R_2$$

Substitute (1) into $R_2$:

$$R_1=[E/(D+E)](D+E)/S(\tan^{-1} \theta_1+1/A)$$

$$=(E/S)(\tan^{-1}\theta_1+1/A) \qquad (2)$$

Here, the equation (2) is a basic equation for calculating variation. With a realistic angle $\theta_1$ (>70 degrees), the recess $R_1$ is proportional to the overetching E and $\tan^{-1} e_1$ of the taper angle and inversely proportional to the selection ratio S and etching anisotropy A.

FIG. 7A shows the dependency of the skirt taper angle $\theta_1$ of the amount of recess $R_1$ when the etching anisotropy A is a parameter. It is clear from FIG. 7A that there is a linear correlation between the amount of recess and the taper angle in a realistic range of taper angle. The absolute values of the amount of recess decrease as the etching anisotropy A increases. However, the gradients, which are a cause of variation, are the same. In the diagram, the encircled portion is under a standard condition; an arrow on the horizontal axis represents a preset range of variation.

FIG. 7B shows the dependency of the etching anisotropy A of the amount of recess. FIG. 7C shows the dependency of the etching selection ratio S of the amount of recess. FIG. 7D shows the dependency of the amount of overetching F of the amount of recess. All parameters are subject to a typical controllability range (+/−20%). FIG. 8 is a table showing the effect of each parameter on the recess $R_1$. A combined variation is calculated in the following manner:

Combined variation=$(0.190^2+0.167^2+0.314^2+0.603^2)^{1/2}$

As shown in FIG. 8, the main cause of variation is overetching E. The reason is that during the process of RIE etching of the underlying film 11 with the use of a sidewall mask, the skirt of the sidewall film 8a retreats gradually. Accordingly, a "skirt undercut structure" is adopted to move the skirt portion back beyond the edge of a sidewall protective film 9a. Thanks to a gradual etching retreat of the skirt portion of the sidewall film 8a, the recess that occurs in the underlying film 11 is reduced. If processing is conducted following the process of an embodiment described below, the retreat of the skirt in principle does not occur. Therefore, it is possible to reduce more of the variation.

Figure 9:
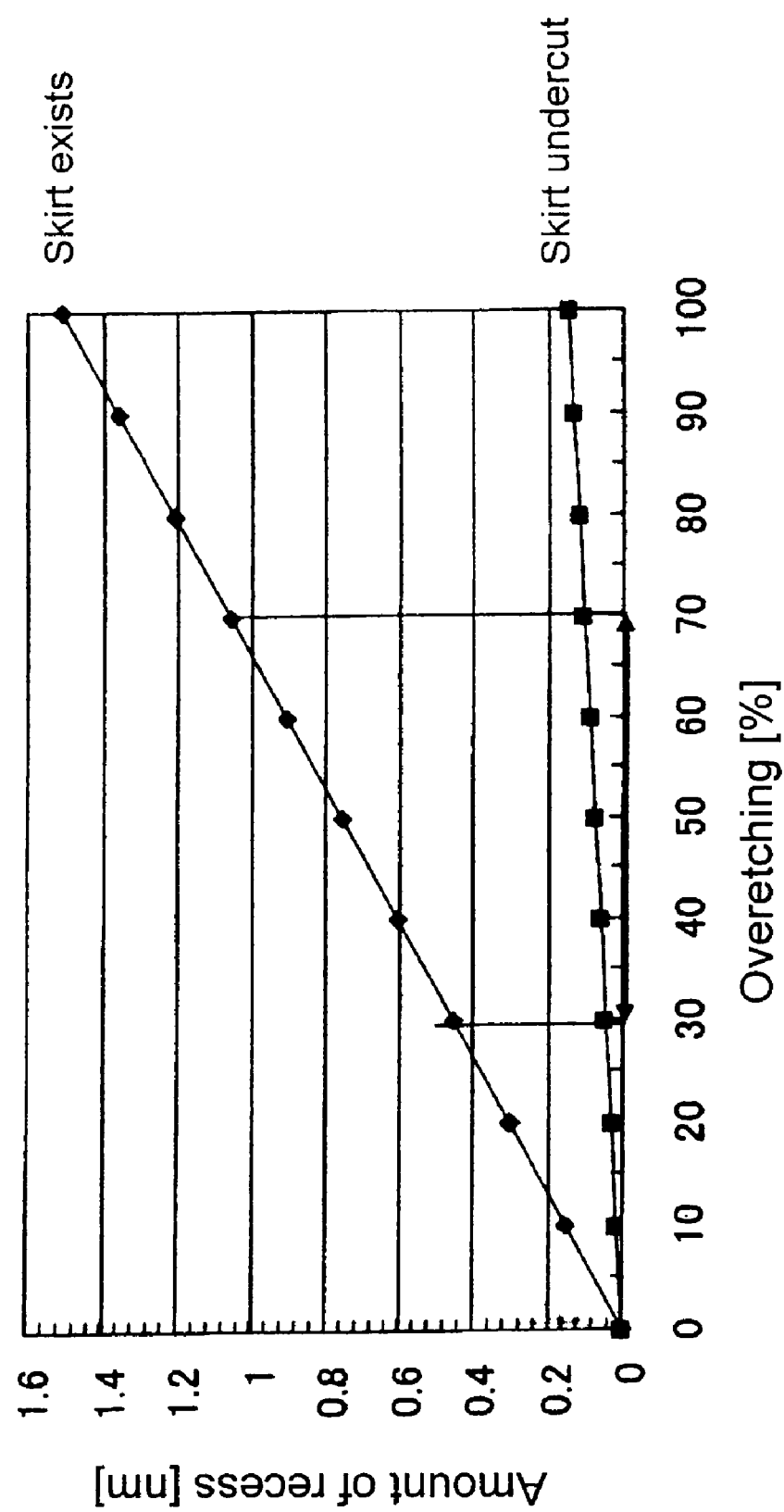
FIG. 9 is a diagram showing the dependency of overetching of the amount of recess in a mask according to an embodiment of the present invention.

As for overetching resistance, FIG. 9 compares a structure having a skirt with a structure whose skirt is undercut. Practically, to undercut the skirt means to improve the etching anisotropy A and the selection ratio S. The etching selection ratio S is associated with the sidewall protective film 9a and the underlying film; the etching anisotropy A is associated with the etching speed of the underlying film 11 relative to the lateral etching speed of the sidewall protective film 9a. Therefore, both improve dramatically. The etching anisotropy A improves to 18 from 5, and the etching selection ratio S to 10 from 5. As a result, as shown in FIG. 9, the amount of recess can be reduced significantly. FIG. 10 is a table showing the effects for the variation factors. Since variation can be significantly reduced in the process of overetching, a combined variation dramatically improves by about 14 percent to 0.098 nm, compared with 0.725 nm in a conventional case.

Embodiment

The following describes a process of producing a mask according to an embodiment of the present invention.

FIGS. 1A, 1B, 2, 3A to 3D, 4, 5A and 5B are diagrams illustrating a process of producing a mask according to the embodiment of the present invention.

Figure 1A:
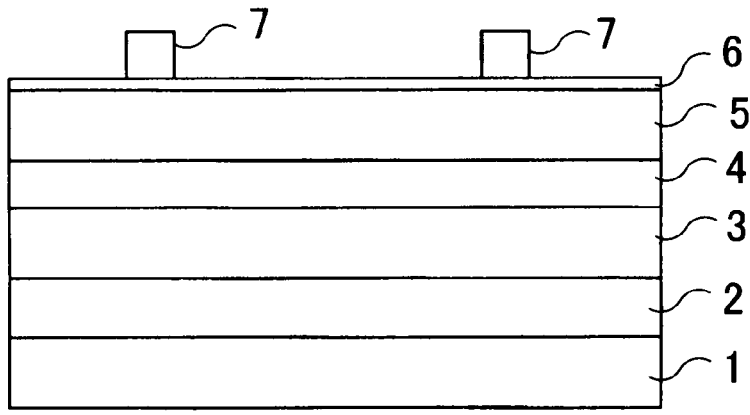
FIGS. 1A and 1B are production-process diagrams showing a method of producing a mask according to an embodiment of the present invention.

First, for example, on a silicon substrate with a film thickness of 0.7 mm (not shown), a tunneling magnetoresistive film 1 is formed as shown in FIG. 1A. For example, a Ta (tantalum) mask film 2 with a film thickness of 70 nm is then formed on the tunneling magnetoresistive film 1. Subsequently, for example, a SiOx (silicon oxide) mask film 3 with a film thickness of 50 nm is formed on the tantalum mask film 2. For example, a Si (silicon) underlying film 4 with a film thickness of 30 nm is formed on the silicon oxide mask film 3. Subsequently, for example, a carbon core film 5 with a film thickness of 80 nm is formed on the silicon underlying film 4. For example, an aluminum oxide (AlOx) mask film 6 with a film thickness of 5 nm is then formed on the carbon core film 5. The tunneling magnetoresistive film 1, tantalum mask film 2, silicon oxide mask film 3, silicon underlying film 4, carbon core film 5 and aluminum oxide mask film 6 can be formed by sputtering method. A resist pattern 7 is then formed by applying an electron beam writing resist on the aluminum oxide mask film 6 and then performing electron-beam writing. In this case, for example, the resist pattern 7 is a pattern with a line of 20 nm and space of 80 nm.

Figure 1B:
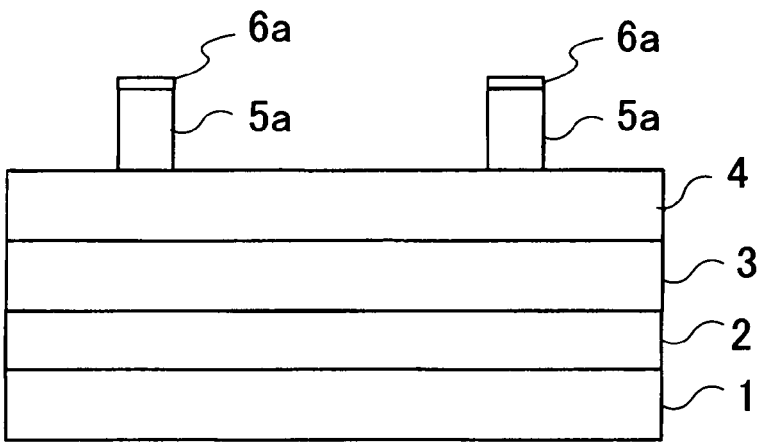

As shown in FIG. 1B, with the use of the resist pattern 7 as a mask, the RIE (Reactive Ion Etching) etching of the aluminum oxide mask film 6 is performed with $CHF_3$ (trifluoromethane) gas. Then, the RIE etching of the carbon core film 5 is performed with oxygen gas to form a rectangular pattern 5a. At this time, the resist pattern 7 is removed by oxygen RIE.

Figure 2:
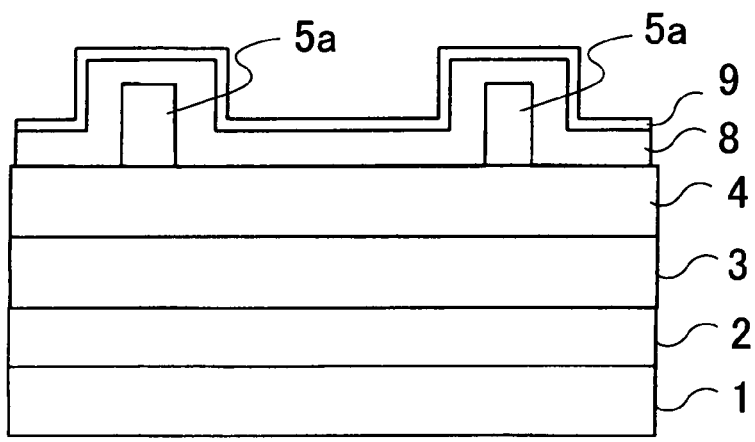
FIG. 2 is a production-process diagram showing the method of producing a mask according to the embodiment of the present invention.

The remaining aluminum oxide film 6a on the pattern 5a is dipped in TMAH (tetramethyl ammonium hydroxide, marketed as NMD3 and manufactured by TOKYO OHKA KOGYO CO., LTD.) and removed. Then, as shown in FIG. 2, with the use of an ALD (Atomic Layer Deposition) method, a SiN (silicon nitride) sidewall film 8 with a film thickness of 15 nm is for example formed so as to cover the side surface and top surface of the pattern 5a. Moreover, with the use of the ALD method, a SiOx (silicon oxide) sidewall protective film 9 with a film thickness of 5 nm is for example formed on the silicon nitride sidewall film 8.

Figure 3A:
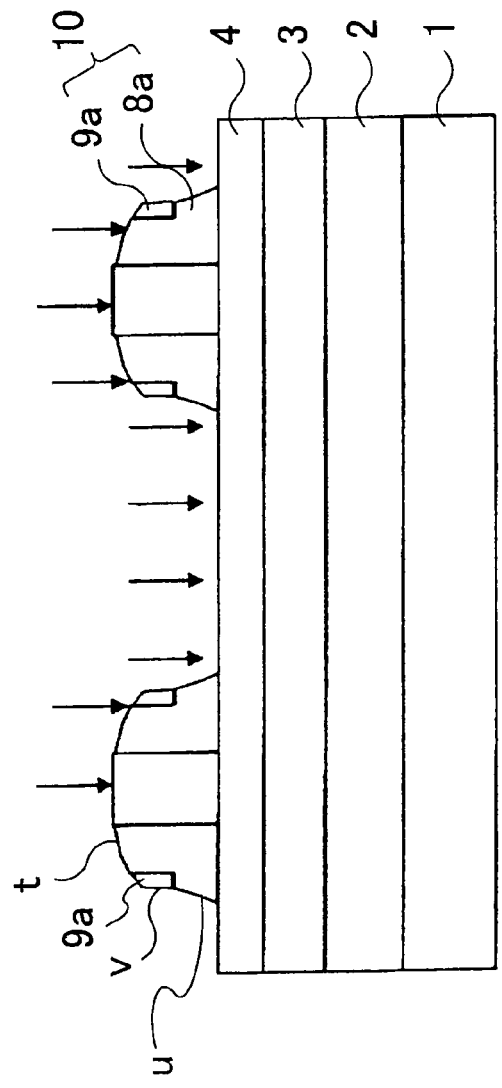
FIGS. 3A to 3D are production-process diagrams showing the method of producing a mask according to the embodiment of the present invention.

Then, as shown in FIG. 3A, with the use of the RIE method, the anisotropic etching of the silicon oxide sidewall protective film 9 is performed with trifluoromethane gas. Furthermore, with the use of the RIE method, the anisotropic etching of the silicon nitride sidewall film 8 is performed with a mixed gas of $CF_4$ (tetrafluoromethane)+$O_2$ (oxygen)+$CHF_3$ (trifluoromethane). Incidentally, the anisotropic etching is performed in the direction indicated by arrow in FIG. 3A. As a result of the anisotropic etching, a laminated film of the silicon nitride sidewall film 8 and silicon oxide sidewall protective film 9, which is formed on the upper portion of the pattern 5a and the silicon underlying film 4, is selectively etched. On the side wall of the pattern 5a, a silicon oxide/silicon nitride sidewall layer 10 is so formed as to contain a silicon nitride sidewall film 8a and a silicon oxide sidewall protective film 9a. Tapers are formed on the upper portion (which is an area indicated by t in FIG. 3A) and side (which is a skirt portion area indicated by u in FIG. 3A) of the silicon nitride sidewall film 8a. Meanwhile, the etching of the silicon oxide sidewall protective film 9a is suppressed.

Figure 3B:
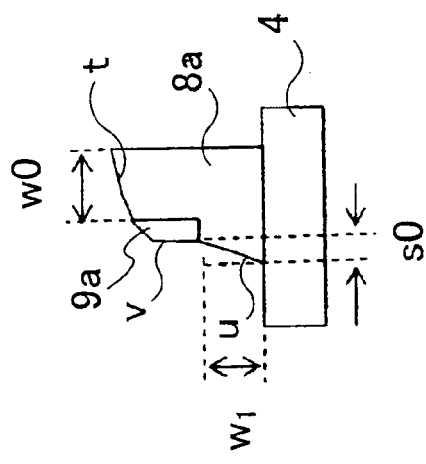

FIG. 3B is an enlarged view of the remaining silicon oxide/silicon nitride sidewall layer 10 on the side of the pattern 5a. As for the side surface of the silicon oxide/silicon nitride sidewall layer 10 that faces the side surface of the pattern 5a, the upper portion (which is an area indicated by v in FIG. 3B) is made of the silicon oxide sidewall protective film 9a; the lower portion (which is an area indicated by u in FIG. 3B) is made of the silicon nitride sidewall film 8a. The height $w_1$ of the area u is substantially equal to the thickness $W_0$ of an area t; the width is s0 in a tapered shape. Here, on the side surface of the silicon oxide/silicon nitride sidewall layer 10 that faces the side surface of the pattern 5a, the upper portion (area v) is referred to as a first area v, and the lower portion (area u) as a second area u. The upper portion (area t) of the silicon nitride sidewall film 8a described above is referred to as a third area t.

Figure 3C:
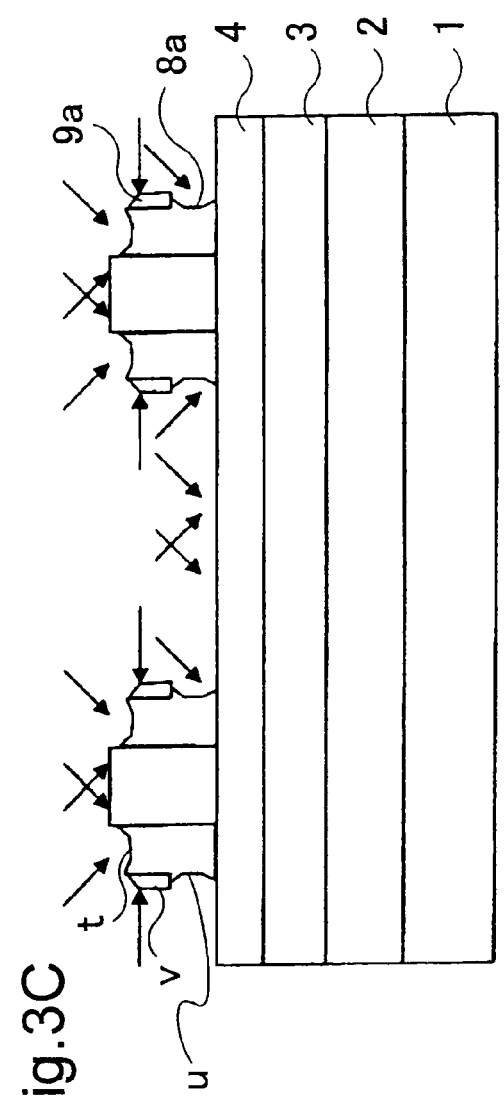

Then, as shown in FIG. 3C, with the use of a CDE (Chemical Dry Etching) method with a mixed gas of $CHF_3$ (trifluoromethane)+$O_2$ (oxygen)+$H_2$ (hydrogen), the isotropic dry etching of the silicon nitride sidewall film 8a is performed; the silicon nitride sidewall film 8a is selectively etched. Meanwhile, the etching of the silicon oxide sidewall protective film 9a is suppressed. Thus, concavities are formed on the upper portion (which is an area indicated by t in FIG. 3C) and side (which is an area indicated by u in FIG. 3C) of the silicon nitride sidewall film 8a.

Figure 3D:
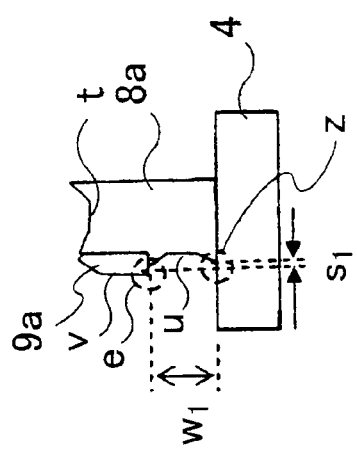

FIG. 3D is an enlarged view of the silicon oxide/silicon nitride sidewall layer 10. The taper of the side u of the silicon nitride sidewall film 8a shown in FIG. 3B is concave due to the etching of the CDE method. Here, at a point z of contact with the silicon underlying film 4, the concavity of the area u of the silicon nitride sidewall film 8a is recessed by the amount equivalent to width s1 from the edge e of the silicon oxide sidewall protective film 9a toward the side surface of the pattern of the silicon oxide/silicon nitride sidewall layer 10. Thanks to the creation of the recess with a width of s1, it is possible to dramatically reduce variation in the process of transferring to the silicon underlying film 4 when the silicon oxide/silicon nitride sidewall layer 10 (sidewall mask) is used.

Figure 4:
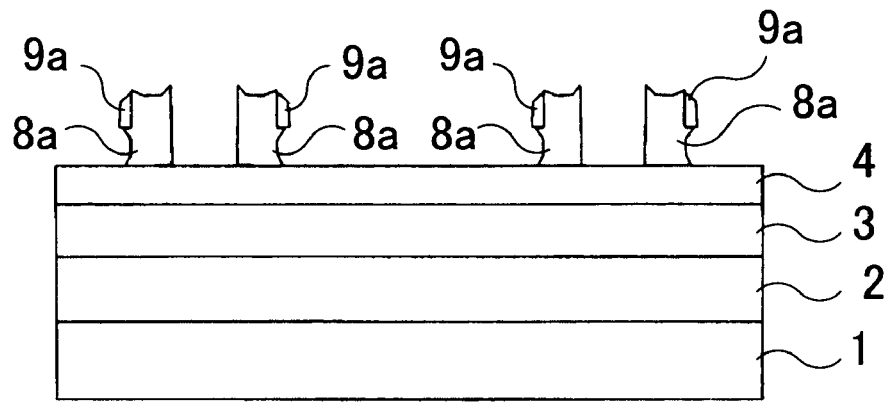
FIG. 4 is a production-process diagram showing the method of producing a mask according to the embodiment of the present invention.

As shown in FIG. 4, the pattern 5a is then removed by RIE with oxygen gas.

Figure 5A:
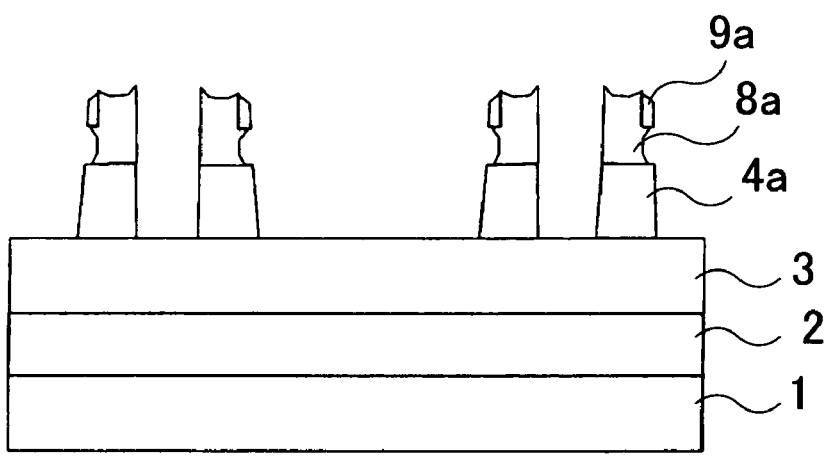
FIGS. 5A and 5B are production-process diagrams showing the method of producing a mask according to the embodiment of the present invention.

Subsequently, as shown in FIG. 5A, the silicon oxide/silicon nitride sidewall layer 10 is used as a mask and the silicon underlying film 4 is etched by RIE with a mixed gas of $SF_6$ (sulfur hexafluoride)+$O_2$ (oxygen).

Figure 5B:
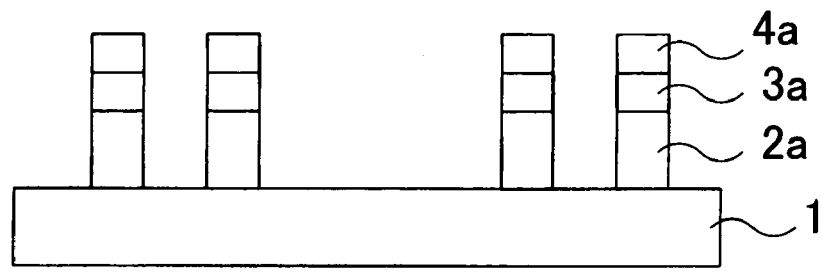

Then, as shown in FIG. 5B, the patterned silicon underlying film 4a is used as a mask and the silicon oxide mask film 3 is etched by RIE with $CHF_3$ (trifluoromethane) gas. Subsequently, the patterned silicon oxide mask film 3a is used and the tantalum mask film 2 is etched by RIE with chlorinated gas.

Moreover, even though the process is not shown, the tunneling magnetoresistive film 1 is patterned with the use of the tantalum mask film 2 to form magnetic dots for magnetic memories (MTJ (Magnetic Tunnel Junction)).

According to the mask production method of the present embodiment, the skirt portion of the sidewall film of the sidewall mask is more recessed than the sidewall protective film. Therefore, it is possible to provide a processing mask with a broad process margin and small variation.

Incidentally, according to the above embodiment, a SiOx (silicon oxide) sidewall film may be used instead of the silicon nitride sidewall film; an AlOx (aluminum oxide) sidewall protective film may be used instead of the silicon oxide sidewall protective film. In this case, as for the anisotropic RIE etching illustrated in FIG. 3A, the aluminum oxide sidewall protective film and the silicon oxide sidewall film are continuously etched with $CHF_3$ (trifluoromethane). As for the isotropic etching illustrated in FIG. 3C, the CDE method can be applied with a mixed gas of $NF_3$ (nitrogen trifluoride)+$N_2$ (nitrogen)+Ar (Argon).

As for isotropic etching, the following can also be adopted: etching with the use of a plasma etching method; etching with the use of a downflow etching method; and etching with the use of a discharge with a higher radical concentration than anisotropic etching. At least the process of isotropic etching shown in FIG. 3C needs to etch the sidewall film isotropically compared with the anisotropic etching shown in FIG. 3A.

As isotropic etching, a method called Atomic Layer Etching (ALET) is also effective. ALET is a technique of: introducing a gas serving as an etchant so that the gas is adsorbed on to the surface of a substrate; generating weak plasma with Ar or the like; and etching only a adsorbing surface layer atomistically. For example, GaAs is formed as a first layer (sidewall film), and Al oxide as a second layer (sidewall protective layer); after $Cl_2$ (chlorine) gas is 1L (Langmuir)-introduced, it is possible to move only one atomic layer of the GaAs plane back with an Ar discharge that is 0.1 W/cm² or less. After the above process is repeated 10 times, a sufficient undercut is obtained. In this case, it is desirable that Al oxide be formed with a thickness of about 1 nm on the surface of the Si underlying layer. Zr oxide is used as a first layer (sidewall film) instead of GaAs and Al oxide is used as a second layer (sidewall protective layer); with $BCl_3$ gas introduced and adsorbed as etchant gas, it is possible to selectively move the Zr oxide back with a weak discharge of Ar gas.

According to the present embodiment, the substrate is supposed to be a silicon substrate. However, the Ta mask film 2, the silicon oxide mask film 3 and the silicon underlying film 4 may be included as the substrate.

Figure 11A:
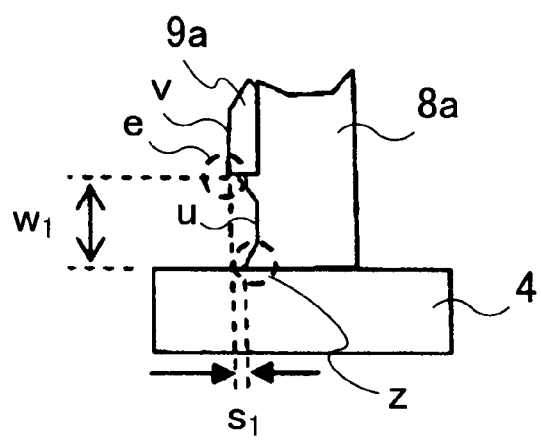
FIGS. 11A to 11D are diagrams showing an example of the shape of a concavity formed by chemical dry etching.
Figure 11B:
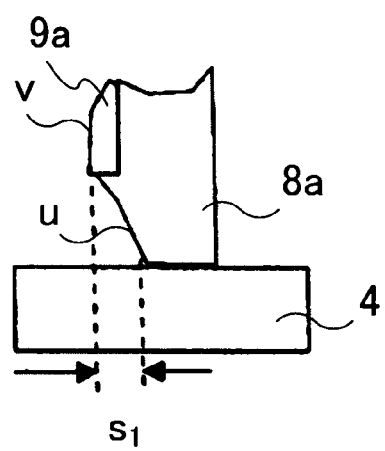
Figure 11C:
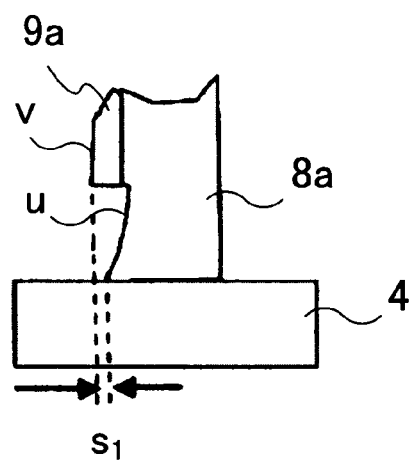

The following describes various shapes of the silicon oxide/silicon nitride sidewall layer 10 formed after the process of isotropic dry etching illustrated in FIG. 3C. The concavity of the second area u of the silicon oxide/silicon nitride sidewall layer 10 is preferably more recessed than the edge of the sidewall protective film 9a. For example, the following structures are desirable: an arc-shaped structure as shown in FIG. 11A; a structure in which the amount of recess $s_1$ monotonously increases as the height decreases, as shown in FIG. 11B; a positively tapered shape as shown in FIG. 11C. The most desirable one is a structure in which the curve of the concavity runs up toward the edge e of the sidewall protective film 9a as the curve gets closer to the point z of contact with the underlying film 4 (i.e., the curve gets closer to the bottom). The reason is that when the RIE etching of the underlying film 4 is performed, RIE gas could get into the portion of height $W_1$, even though just about 10 nm to 20 nm, and the underlying film's portion indicated by $s_1$ could be etched. Accordingly, as shown in FIGS. 11A and 11C, it is desirable to have a structure in which a positively tapered shape is formed as the curve comes very near to the underlying film.

Figure 11D:
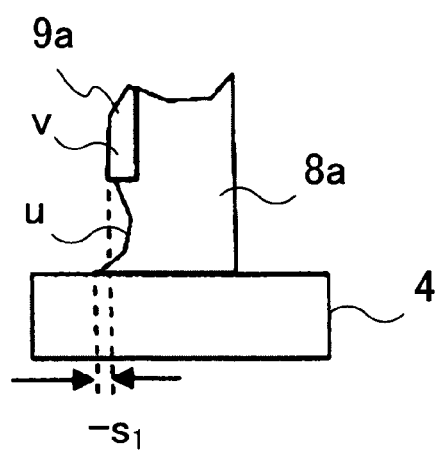

Incidentally, it is not necessary for the whole concavity of the second area u of the silicon oxide/silicon nitride sidewall layer 10 to be recessed back from the edge of the sidewall protective film 9*a*. As shown in FIG. 11D, even if the curve of the concavity slightly projects, there is an effect of reducing the amount of recess compared with a conventional skirt structure. Incidentally, it is desirable that the amount of projection $S_1$ be one-third or less of height $W_1$.

Incidentally, the shape of the silicon oxide/silicon nitride sidewall layer 10 is not limited to the above one. It is desirable that the average distance from the side u of the sidewall film 8*a* on the side surface of the silicon oxide/silicon nitride sidewall layer 10 to the pattern 5*a* be shorter than the average distance from the side v of the sidewall protective film 9*a* to the pattern 5*a*. It is more preferable that the entire side u of the sidewall protective film 9*b* be closer to the pattern 5*a* than the side v of the sidewall protective film 9*b* is.

What is claimed is:

1. A method of producing magnetic dots for magnetic memories, comprising:
   a step of forming an underlying film;
   a step of forming a pattern on the underlying film;
   a step of forming a first film that covers a top surface and a side surface of the pattern and contains a first material;
   a step of forming a second film containing a second material on the first film;
   a step of performing anisotropic etching of the first and second films in a way that forms a sidewall layer including the first and second films on the side surface of the pattern and removes the first and second films in any location other than the sidewall layer;
   a step of performing isotropic etching of the first film of the sidewall layer;
   a step of removing the pattern; and
   a step of performing a second anisotropic etching of the underlying film using the first film of the sidewall layer as a mask.

2. The method according to claim 1, wherein,
   the step of performing anisotropic etching comprises forming the sidewall layer in such a way that a first area above a plane facing the side surface of the pattern is made of the second material and a second area below the plane is made of the first material, and
   the step of performing isotropic etching comprises of forming the second area in such a way that the average distance from the second area to the side surface of the pattern is shorter than the average distance from the first area to the side surface of the pattern.

3. The method according to claim 2, wherein
   the step of performing isotropic etching comprises of forming the second area in such a way that the second area is more recessed toward the side surface of the pattern than an edge of the first area.

4. The method according to claim 3, wherein
   the step of performing isotropic etching comprises of forming the second area in such a way that the second area is in the shape of an arc so as to be close to the side surface of the pattern and is closer to the edge of the first area at a point of contact between the sidewall layer and the substrate.

5. The method according to claim 1, wherein
   the step of performing isotropic etching comprises using a plasma etching method.

6. The method according to claim 1, wherein
   the step of performing isotropic etching comprises using a downflow etching method.

7. The method according to claim 1, wherein
   the step of performing isotropic etching comprises using a discharge with a higher radical concentration than the performing anisotropic etching.

8. The method according to claim 2, wherein,
   the first material contains silicon nitride, and
   the second material contains silicon oxide.

9. The method according to claim 2, wherein,
   the first material contains silicon oxide, and
   the second material contains aluminum oxide.

* * * * *